United States Patent [19]

Kazama

[11] Patent Number: 5,410,260
[45] Date of Patent: Apr. 25, 1995

[54] COIL SPRING-PRESSED NEEDLE CONTACT PROBE

[75] Inventor: Toshio Kazama, Nagano, Japan

[73] Assignee: NHK Spring Co., Ltd., Japan

[21] Appl. No.: 148,489

[22] Filed: Nov. 8, 1993

[30] Foreign Application Priority Data

Nov. 9, 1992 [JP] Japan .................. 4-323573

[51] Int. Cl.6 ............................................. G01R 1/04
[52] U.S. Cl. .................................................. 324/758
[58] Field of Search ............ 324/158 P, 158 F, 158 R, 324/756-758

[56] References Cited

U.S. PATENT DOCUMENTS

| | | | |
|---|---|---|---|
| 4,528,500 | 7/1985 | Lightbody et al. | 324/73 PC |
| 4,931,726 | 6/1990 | Kasukabe et al. | 324/158 F |
| 5,003,255 | 3/1991 | Kazama | 324/158 P |
| 5,004,977 | 4/1991 | Kazama | 324/158 P |
| 5,084,673 | 1/1992 | Kazama | 324/158 P |
| 5,092,774 | 3/1992 | Milan | 324/158 F |
| 5,189,364 | 2/1993 | Kazama | 324/158 P |
| 5,200,695 | 4/1993 | Kazama | 324/158 P |

FOREIGN PATENT DOCUMENTS

60-154868  10/1985  Japan .................. G01R 1/067

Primary Examiner—Kenneth A. Wieder
Assistant Examiner—Barry C. Bowser
Attorney, Agent, or Firm—Skjerven, Morrill, MacPherson, Franklin, & Friel

[57] ABSTRACT

In a contact probe, the conventional tubular holder for receiving the needle member and the compression coil spring is eliminated by receiving them in a through hole provided in an insulator assembly consisting of at least two layers of insulating plate members. By thus eliminating the need for a tubular holder, the effective outer diameter of the contact probe can be reduced, and the density of contact probes in a contact probe assembly including a multiplicity of such contact probes in a parallel relationship can be increased without reducing the spring force of the coil spring or the mechanical strength of the needle member of each contact probe.

23 Claims, 8 Drawing Sheets

COIL SPRING-PRESSED NEEDLE CONTACT PROBE

CROSS REFERENCE TO RELATED PATENTS AND APPLICATIONS

The following patents and patent applications are directed to subject matters similar to those of the present application, and are commonly assigned to NHK Spring Co., Ltd. The contents of these applications are hereby incorporated in the present application by reference.

| Application Number | Filing Date | Remarks |
| --- | --- | --- |
| 08/148,488 | November 8, 1993 | |
| 08/013,465 | February 4, 1993 | Attorney's Docket Number: A-333 |
| 07/739,051 | July 30, 1991 | U.S. Pat. No. 5,200,695 issued April 6, 1993 |
| 07/737,763 | July 30, 1991 | U.S. Pat. No. 5,189,364 issued February 23, 1993 |
| 07/600,198 | October 19, 1990 | Div. of 07/536,516 U.S. Pat. No. 5,084,673 issued March 26, 1991 |
| 07/536,516 | October 19, 1990 | U.S. Pat. No. 5,003,255 issued March 26, 1991 |
| 07/424,511 | October 20, 1989 | U.S. Pat. No. 5,004,977 issued April 2, 1991 |

TECHNICAL FIELD

The present invention relates to a contact probe for electrically accessing various parts of printed circuit boards, semiconductor devices and other electric and electronic components, and in particular to a contact probe which is suited to be arranged in a contact probe assembly at a high density so that a plurality of points concentrated in an extremely small area may be accessed at the same time.

BACKGROUND OF THE INVENTION

Conventionally, the contact probe used in contact probe assemblies for electrically testing electroconductive patterns of printed circuit boards and electronic components in general comprises an electroconductive needle member, a tubular holder slidably receiving the needle member, and a coil spring for urging the forward end of the needle member out of the tubular holder so that the forward end of the needle member may be brought into contact with an object to be tested with a certain elastic force pushing the needle member against this object.

Figure 8:
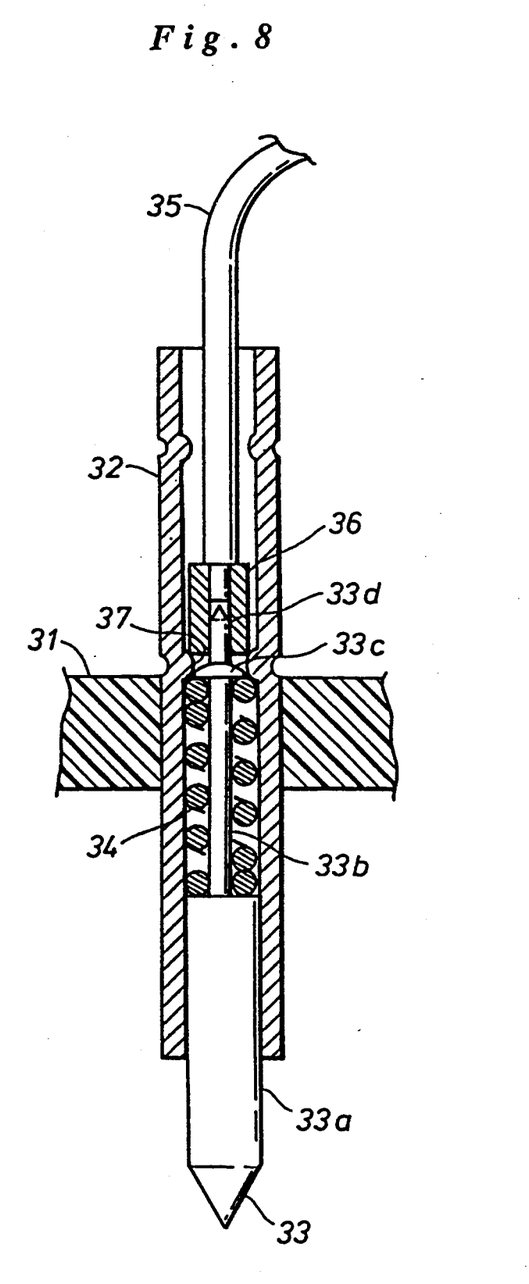
FIG. 8 is a vertical sectional view showing a conventional contact probe.

FIG. 8 shows such a conventional contact probe in which a receptacle 32 serving as a tubular holder is passed through and fixedly secured to an insulator 31 consisting of a plate or block member, and an electroconductive needle member 33 is slidably received in the receptacle 32. The needle member 33 consists of a large diameter portion 33a and a small diameter portion 33b. In FIG. 8, the large diameter portion 33a is provided in a lower part of the needle member 33 while the small diameter portion 33b is provided in an upper part thereof. The upper end of the small diameter portion 33b is provided with an enlarged head 33c, for instance by crimping, and a compression coil spring 34 is coaxially fitted on the small diameter portion 33b between an annular shoulder surface defined by the upper end of the large diameter portion 33a and the head 33c with a certain pre-compression.

The upper end of the head 33c is provided with a coaxial projection 33d, and a lead wire 35 is electrically connected to the needle member 33 via a connector 36 formed as a sleeve member which is securely fitted onto this projection 33d. A central part of the receptacle 32 is provided with an annular projection 37 projecting in a radially inward direction, for instance by crimping, which allows the passage of the head 33c but prevents the passage of the connector 37 and the compression coil spring 34.

Therefore, when the insulator 31 is lowered, and the forward end of the needle member 33 is brought into contact with an object to be tested (not shown in the drawing), the compression coil spring 34 is compressed, and the needle member 33 is pushed against the object to be tested with a suitable pressure. The needle member 33 is prevented from completely coming out of the receptacle 32 by the connector 36 being engaged by the annular projection 37. The electric signal obtained by the needle member 33 is transmitted to a control unit not shown in the drawing via the lead wire 35.

A plurality of such contact probes are normally arranged in parallel in a contact probe assembly so that a plurality of points may be electrically accessed at the same time. In particular, due to the need for increasingly more compact design of electronic equipment, the points to be tested are often extremely densely arranged, and it is desired to minimize the distance between adjacent contact probes in such a contact probe assembly. This can be accomplished by reducing the overall diameter of each contact probe, but it was not possible to reduce the diameter beyond a certain limit imposed by the difficulty in ensuring a sufficient spring force of the compression coil spring, and a sufficient mechanical strength to the needle member.

BRIEF SUMMARY OF THE INVENTION

In view of such problems of the prior art, a primary object of the present invention is to provide a contact probe having a minimized overall diameter so that a large number of contact probes may be arranged in a given area of a contact probe assembly.

A second object of the present invention is to provide a contact probe having a minimized overall diameter, but capable of providing a sufficient spring force for urging its needle member.

A third object of the present invention is to provide a contact probe having a minimized overall diameter, but capable of providing a sufficient mechanical strength for its needle member.

A fourth object of the present invention is to provide a contact probe assembly including a plurality of densely arranged contact probes which can readily adapt itself to various applications.

These and other objects of the present invention can be accomplished by providing a contact probe, comprising: an electroconductive needle member having a forward end and a rear end; a holder slidably receiving the needle member; a coil spring surrounding the needle member and received in the holder, and urging the needle member so as to elastically project the forward end of the needle member from one end of the holder; first engagement means provided in the holder for engaging an end of the coil spring remote from the needle member; second engagement means provided in the needle member for engaging another end of the coil spring adjacent to the needle member; and lead means for establishing an electric contact between the needle member and an external circuit; the holder comprising a primary insulator member having a through hole for receiving the needle member and the coil spring therein, a secondary insulator member having a first opening coaxially aligned with an end of the through hole and being dimensioned so as to allow the forward end of the needle member to project therefrom but prevent passage of the rear end of the needle member, and a tertiary insulator member having a second opening coaxially aligned with another end of the through hole opposite from the one end, the second opening being provided with an inner diameter smaller than an outer diameter of the coil spring but large enough to allow passage of the lead means therethrough.

By thus eliminating the need for a tubular holder, the effective outer diameter of the contact probe can be reduced, and the density of contact probes in a contact probe assembly including a multiplicity of such contact probes in a parallel relationship can be increased without reducing the spring force of the coil spring or the mechanical strength of the needle member of each contact probe.

Depending on the application, the lead means may be replaced by an additional needle member so that two circuits, for instance placed one over the other, may be temporarily connected for testing purposes. If desired, an extension of the coil spring may be conveniently used as such an additional needle member. Furthermore, the insulator assembly may consist of two parts, instead of the three parts, if an annular shoulder surface is defined in the through hole of the primary insulating member for restricting the extent to which the forward end of the needle member projects therefrom.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
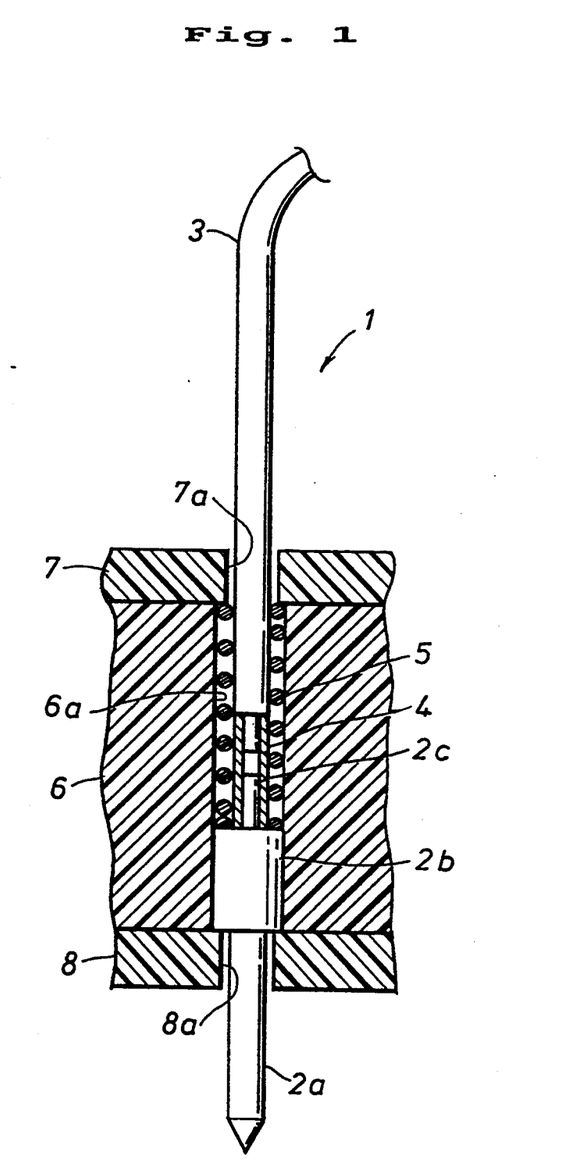
FIGS. 1 through 6 are vertical sectional views showing first through sixth embodiments of the contact probe according to the present invention.

FIG. 1 is a vertical sectional view of a contact probe 1 according to the present invention. An electroconductive needle member 2 used in this contact probe 1 consists of a forward end portion 2a having a pointed forward end, a middle portion 2b which is larger in diameter than the forward end portion 2a, and a rear end portion 2c which projects from the upper end (in FIG. 1) of the middle portion 2b and is smaller in diameter than the middle portion 2b. These different portions 2a through 2c of the needle member 2 all have circular cross sections, and are coaxial with one another.

A tubular connector 4 is securely connected to an exposed end of a core wire of a lead wire 3 at its one end, and elastically fitted onto the rear end 2c at its other end so that an electric connection may be established between the lead wire 3 and the needle member 2.

The rear end portion 2c of the needle member 2 is surrounded by the connector 4, and a forward end portion of the lead wire 3 and the connector 4 are surrounded by a coil spring 5. The outer diameter of the coil spring 5 is slightly smaller than the outer diameter of the middle portion 2b of the needle member 2.

In this case, the holder for receiving the needle member 2 and the coil spring 5 is comprised of a middle insulator 6 consisting of a plate or block member having a relatively large thickness, and upper and lower insulators 7 and 8 laminated over the upper and lower surfaces of the middle insulator 6, respectively, each having a thickness substantially smaller than that of the middle insulator 6. More specifically, the middle insulator 6 is provided with a through hole 6a having a slightly larger inner diameter than the outer diameter of the middle portion 2b of the needle member 2, and slidably receiving the needle member 2. The upper insulator 7 is provided with an opening 7a which is large enough to allow the passage of the lead wire 3 but is small enough to engage the coil spring 5. The lower insulator 8 is likewise provided with an opening 8a which is large enough to allow the passage of the forward end portion 2a but is small enough to engage the middle portion 2b.

The insulators 6 through 8 are integrally joined together by suitable fasteners such as threaded screws not shown in the drawing, and the openings 7a and 8a and the through holes 6a provided in these insulators 6 through 8 are aligned in coaxial relationship. Thus, the needle member 2 and the coil spring 5 are retained in the through hole 6a in a slidable manner, but are prevented from being dislodged from the through hole 6a by the openings 7a and 8a.

In reality, a large number of such contact probes are arranged in a common insulator assembly consisting of the three insulators 6 through 8. When this contact probe assembly is lowered, and the forward end of the forward end portion 2a of each of the needle members 2a is brought into contact with a point of an object to be tested (not shown in the drawing), the compression coil spring 5 is compressed, and the needle member 2 is pushed against the point to be tested with a suitable pressure. The electric signal obtained by the needle member 2 is transmitted to a control unit not shown in the drawing via the lead wire 3.

According to the present invention, because the receptacle for each of the contact probes is formed by the insulator assembly itself without using any tubular member for receiving each of the needle members, the contact probes may be arranged in more dense distribution than heretofore.

The fabrication of the contact probe assembly is also simple. First, the needle members 2 and compression coil springs 5 are placed inside the through holes 6a, and the upper and lower insulators 7 and 8 are then placed over the upper and lower surfaces of the middle insulator 6.

Thus, according to the present invention, by arranging such contact probes in a single insulator assembly, there is provided a contact probe assembly which can access a plurality of points at the same time. Furthermore, the absence of the tubular receptacle for each contact probe allows the contact probes to be arranged more closely to each other than heretofore, at least by twice the wall thickness of a conventional contact probe, and allows a sufficient spring force to be produced from the compression coil spring and ensures a sufficient mechanical strength to the needle member for a given distribution density of the contact probes. Thus, the contact probe of the present invention can be readily adapted to the increasingly compact design of electronic equipment and devices.

Figure 7:
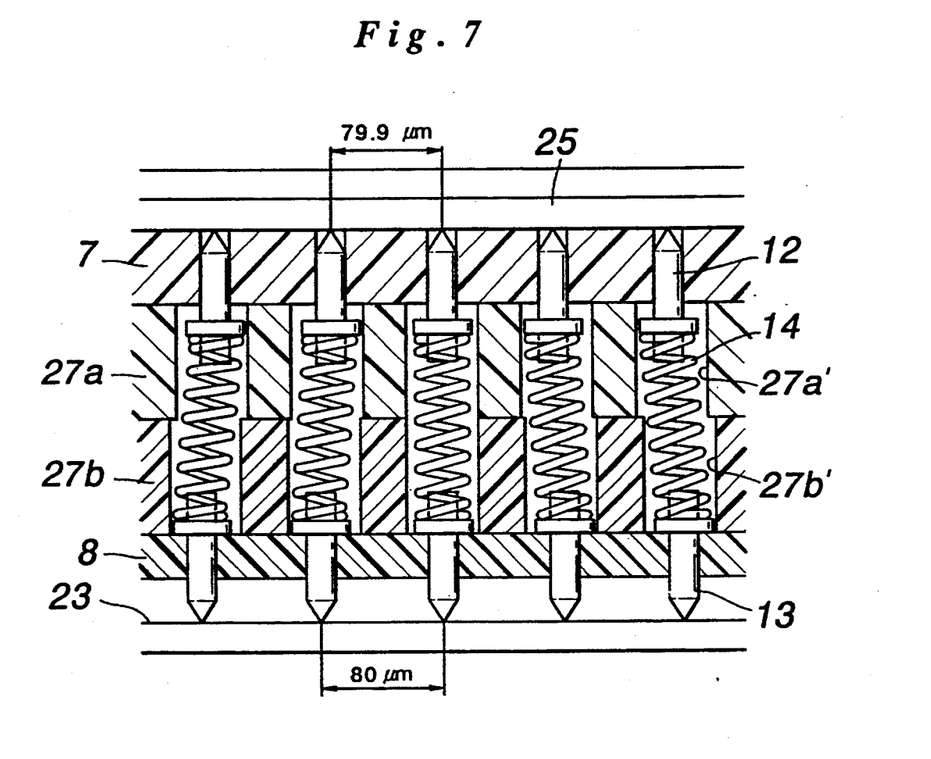
FIG. 7 is a sectional view of an embodiment of the contact probe assembly according to the present invention.

As can be understood by comparing FIGS. 1 and 7, the overall height or the length of the contact probe can be reduced, for instance by 30 to 40% for a given stroke of the needle member, and a more compact design of the contact probe assembly is thus made possible. Furthermore, according to the conventional contact probe, because the needle member and the coil spring slide over the inner surface of the receptacle, metallic powder is produced, and a periodic servicing and replacement was necessary. On the other hand, according to the present invention, by using low friction synthetic resin material such as Teflon ® and aromatic polyester resins for the insulators, generation of metallic or other powder can be favorably controlled so that not only the durability of the contact probe can be improved but also a high level of precision in the movement of the needle member can be ensured through elimination of play in the movement of the needle member.

In the drawings, the radial or horizontal dimensions are significantly exaggerated as compared to the longitudinal or vertical dimensions for the convenience of illustration. In reality, the contact probe is longer and thinner than illustrated. For instance, the typical outer diameters of the forward end portion 2a and the middle portion 2b are 0.20 mm and 0.27 mm, respectively, while the thickness of the insulator assembly 6 through 8 is 9 mm.

Figure 2:
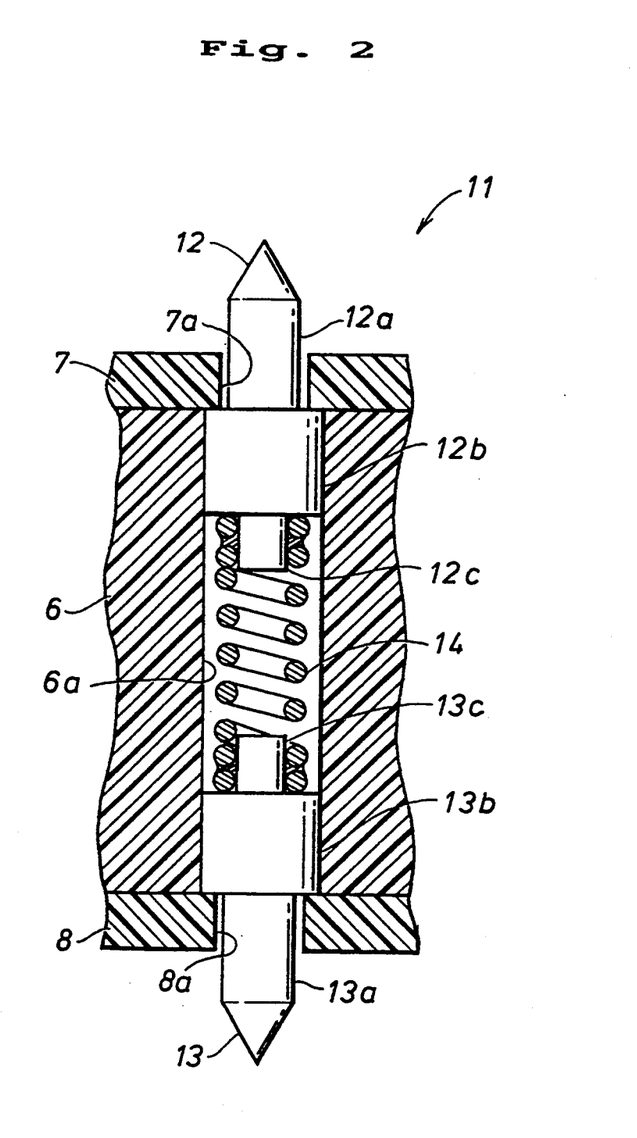

FIG. 2 shows a second embodiment of the present invention. In FIG. 2, the parts corresponding to those of the previous embodiments are denoted with like numerals. In this contact probe 11, the structure of the insulator assembly 6 through 8 is not different from that of the previous embodiment, but this contact probe 11 is provided with an upper needle member 12 adapted to project from the opening 7a of the upper insulator 7, in addition to a lower needle member 13 adapted to project from the opening 8a of the lower insulator 8 so that an electric connection may be established between the two points accessed by the upper and lower needle members 12 and 13.

The upper and lower needle members 12 and 13 each consist of a forward end portion 12a or 13a, a middle portion 12b or 13b, and a rear end portion 12c or 13c substantially in the same manner as the needle member 2 of the previous embodiment. Thus, the two needle members 12 and 13 are slidably received in a common through hole 6a provided in the middle insulator 6, and are kept thereby by being engaged by the upper and lower insulators 12 and 13, respectively.

A compression coil spring 14 is coaxially interposed between the two needle members 12 and 13, and two ends of the compression coil spring 14 are soldered to the rear end portions 12c and 13c of the corresponding needle members 12 and 13. Thus, the needle members 12 and 13 are electrically connected to each other via the compression coil spring 14.

This contact probe 11 is suitable for temporarily connecting two circuits placed one over the other for measuring and testing purposes. In particular, by arranging a plurality of such contact probes in a common insulator assembly, a plurality of pairs of points can be electrically connected to each other at the same time.

Figure 3:
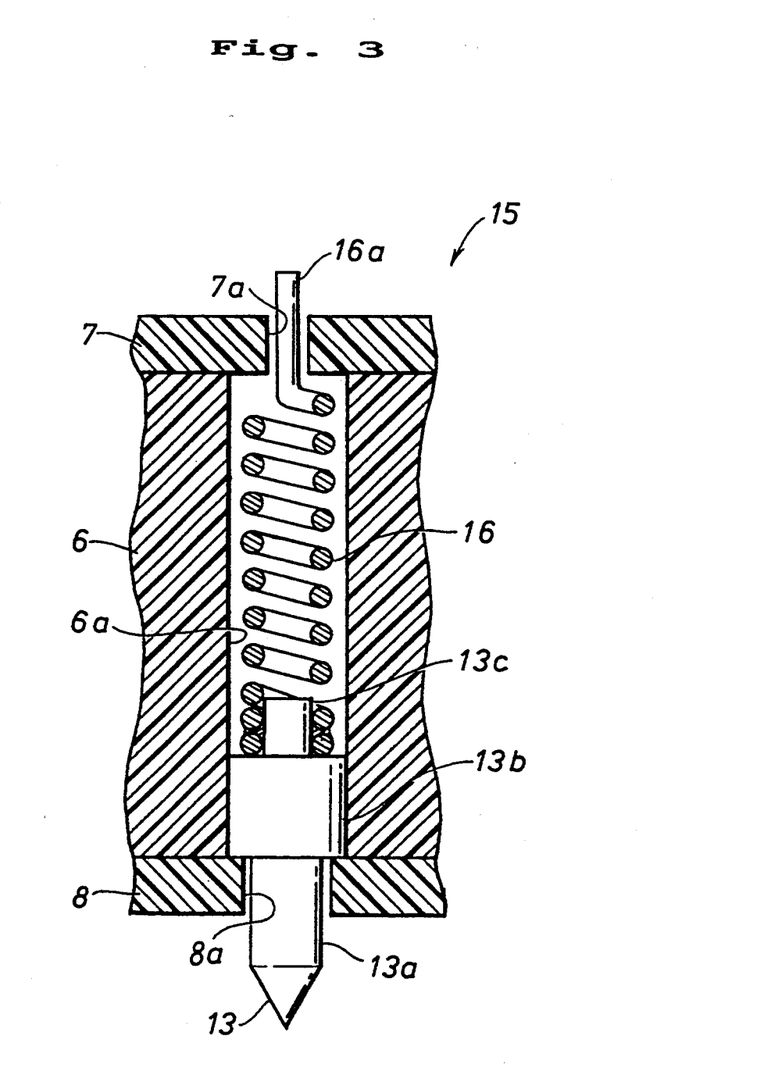

FIG. 3 shows a third embodiment of the present invention. In FIG. 3, the parts corresponding to those of the previous embodiments are denoted with like numerals. In this contact probe 15, the structure of the insulator assembly 6 through 8 is also not different from that of the first embodiment. In this contact probe 11, a single needle member 13 projects from the opening 8a of the lower insulator 8, and a compression coil spring 16 interposed between the needle member 13 and the upper insulator 7 urges this needle member 13 downward in the same way as the coil spring 5 of the first embodiment. The end 16a of the coil spring 16 remote from the needle member 13 is passed through the opening 7a provided in the upper insulator 7. The end of the coil spring adjoining the needle member 13 is soldered to the rear end portion 13c of the needle member 13.

This contact probe 11 allows two circuits placed one over the other to be temporarily connected with each other for measuring and testing purposes, and is substantially equivalent to the contact probe 11 of the second embodiment in effect, but is simpler in structure due to the absence of the upper or the second needle member.

Figure 4:
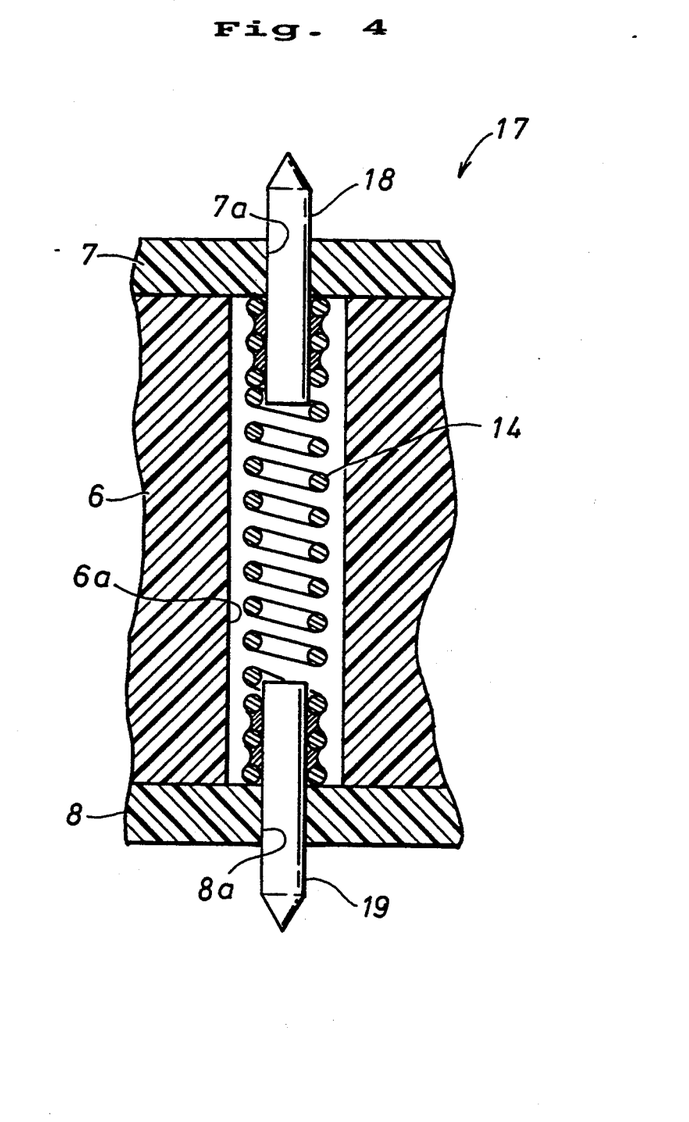

FIG. 4 shows a fourth embodiment of the present invention. In FIG. 4, the parts corresponding to those of the previous embodiments are denoted with like numerals. In this contact probe 17, the structure of the insulator assembly 6 through 8 is also not different from that of the first embodiment. In this contact probe 17, upper and lower needle members 18 and 19 similar to the upper and lower needle members 12 and 13 of the second embodiment each consist of a straight needle member 18 or 19 which has a uniform circular cross section except that its forward end is sharply pointed. The two ends of the compression coil spring 14 are wrapped around the base ends of the corresponding needle members 18 and 19, and are soldered thereto. The thus soldered ends of the compression coil spring 14 serve as means for defining the extent to which the needle members can project from the openings 7a and 8a of the upper and lower insulators 7 and 8 as well as means for engaging the two ends of the compression coil spring 14 to the corresponding needle members 18 and 19.

This embodiment operates in a similar fashion as the second and third embodiments, and may be used for temporarily connecting two circuits placed one over the other for measuring and testing purposes. According to this embodiment, each of the needle members may be made of a straight wire member, and the fabrication of the needle members is simplified.

Figure 5:
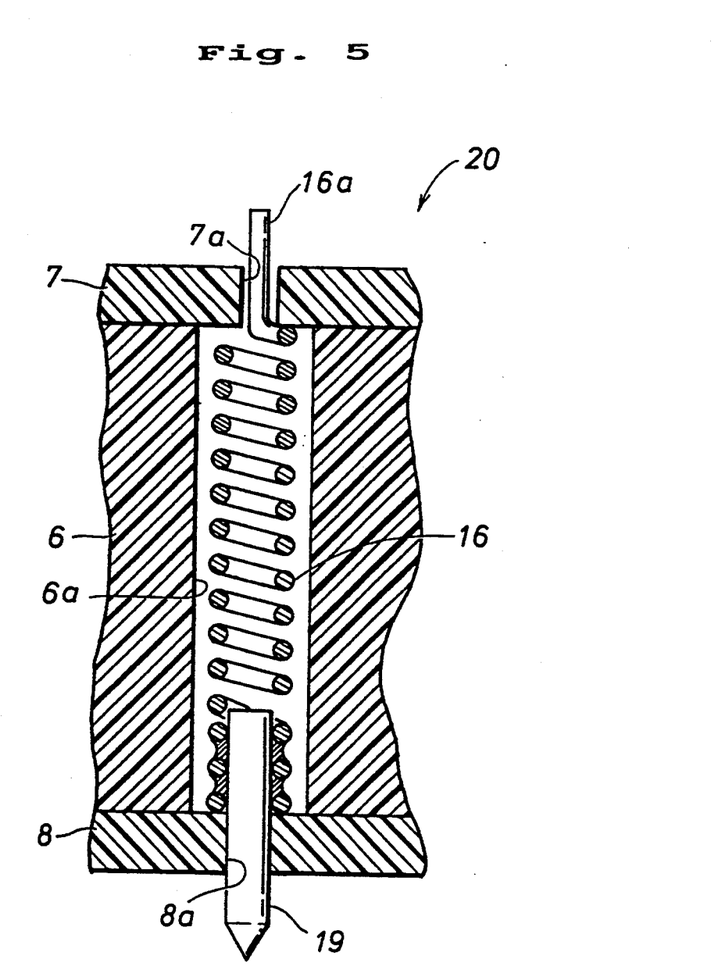

FIG. 5 shows a fifth embodiment of the present invention. In FIG. 5, the parts corresponding to those of the previous embodiments are denoted with like numerals. In this contact probe 20, the structure of the insulator assembly 6 through 8 is also not different from that of the first embodiment. This contact probe 20 is similar to the contact probe 11 of the second embodiment, but the needle member 19 projecting from the opening 8a of the lower insulator 8 consists of a straight wire member in the same way as the needle members 18 and 19 of the fourth embodiment.

This embodiment operates in a similar fashion as the second through fourth embodiments, and may be used for temporarily connecting two circuits placed one over the other for measuring and testing purposes. According to this embodiment, only one needle member is required, and it may be made of a straight wire member. Thus, the fabrication of the contact probe is extremely simplified.

Figure 6:
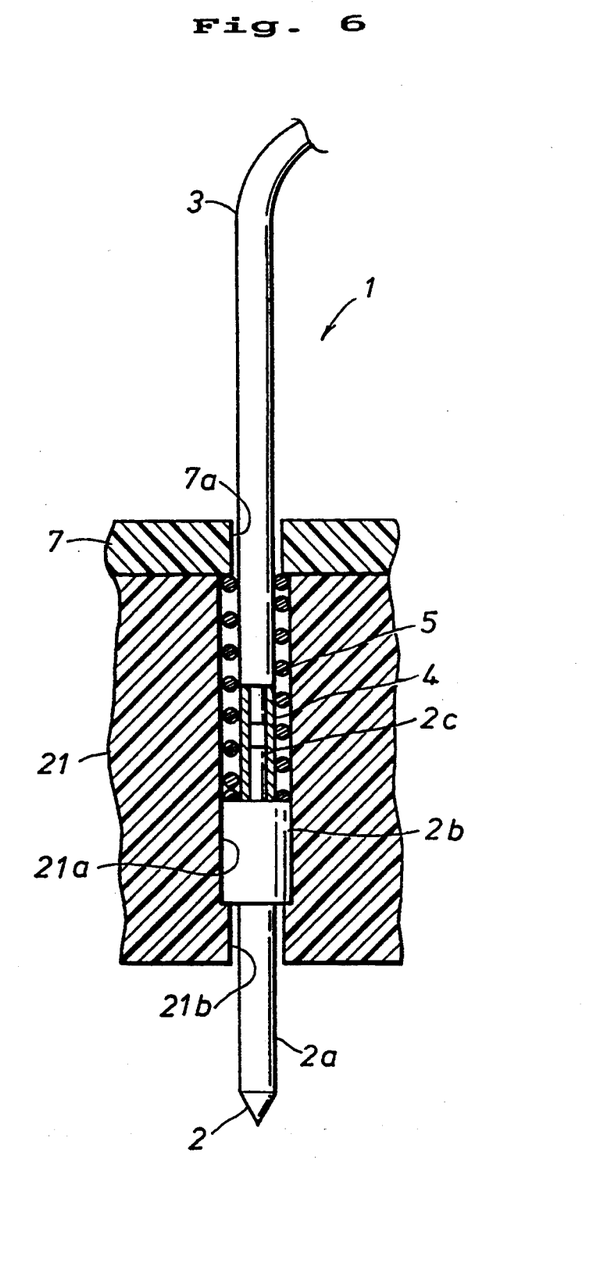

FIG. 6 shows a sixth embodiment of the present invention, in which the insulator assembly consists of a middle insulator 21 and an upper insulator 7. No lower insulator 8 is used as opposed to the previous embodiments. The through hole of the middle insulator 21, in this case, consists of a main large diameter part 21a and a small diameter part 21b corresponding to the opening 8a of the lower insulator 8 in the previous embodiments. Otherwise, the needle member 2 and the parts associated therewith are similar to those of the first embodiment.

An annular shoulder surface defined between the large diameter main part 21a and a small diameter part 21b serves as means for limiting the extent to which the needle member 2 can project downward from the contact probe.

According to this embodiment, the structure of the insulator assembly is simplified, and the assembling process is also simplified because the needle member 2 can be readily fitted into the main part of the through hole 21a from above.

FIG. 7 shows a part of a contact probe assembly including a plurality of contact probes each of which may consist of any one of the above described contact probes. The contact probes used in this particular assembly are substantially identical to the one illustrated in FIG. 2, and each comprises an upper needle member 12, a lower needle member 13, and a compression coil spring 14 interposed between the upper and lower needle members 12 and 13. Similarly, the upper and lower needle members 12 and 13 are allowed to project upward and downward, respectively, from upper and lower insulators 7 and 8 of the insulator assembly by a certain prescribed extent defined by the abutment of the large diameter portion of each of the needle members with the periphery of the associated opening of the associated insulator.

In this case, the pitch of the upper needle members 12 is slightly smaller than that of the lower needle member 13. The difference in the pitch may be so small that it may be insignificant where there are only a small number of contact probes, but the cumulative deviation in alignment becomes significant as the number of the contact probes in each array is increased. Therefore, even though the difference in the pitch may be small, some measure must be taken to accommodate the difference in the pitch.

In this embodiment, the middle insulator consists of two layers of middle insulators 27a and 27b. In FIG. 7, the needle members 12 and 13 of the contact probe in the middle are exactly aligned with each other, but those on either side of the middle contact probe are offset from each other. This offset is 0.01 $\mu$m for the one next to the middle one, 0.02 $\mu$m for the one next but one to the middle one, and so on.

To account for such an offset, the through holes 27a' and 27b' provided in the middle insulators 27a and 27b are offset from each other in the same way as the upper and lower needle members are offset from each other.

Thus, according to this contact probe assembly, it is possible to readily accommodate any slight offsetting in the upper and lower arrays of points 25 and 23 to be accessed by offsetting the through holes 27a' and 27b' of the middle insulators 27a and 27b as well as the needle members 12 and 13 accordingly.

Such offsetting of arrays of points to be accessed occurs, for instance, when one of the arrays of points to be accessed undergoes a thermal expansion or contraction when the parts associated with the two arrays of points to be accessed are assembled together by soldering, thermal adhesion and other processes involving heat, and some offsetting is present at the time of testing preceding the assembling process. The offsetting is eliminated when the two parts are finally joined together.

Furthermore, even in the absence of such offsetting, forming the middle insulator with two or more of layers of middle insulators is advantageous because the need for forming a large number of long and fine bores for passing the contact probes can be eliminated because the holes in each layer of the middle insulators have a limited length, and can therefore be formed with high precision without any undue difficulty.

Thus, according to the present invention, a contact probe can be fabricated without requiring any tubular receptacle, and the fabrication process is therefore simplified. Due to the elimination of the tubular receptacle, the contact probes may be more closely arranged in a contact probe assembly, and, for a given density of contact probes in a contact probe assembly, the mechanical strength of the needle member and the spring force of the coil spring may be both increased. In other words, for a given mechanical strength of the needle member and a spring force of the compression coil spring, the distribution density of the contact probes can be increased because the outer diameter of each of the contact probes can be reduced.

Furthermore, by using wear resistant and low friction material for the middle insulator, the durability of the contact probe can be improved, and the generation of metallic and other powder detrimental to the operation of the contact probe can be minimized. If the middle insulator consists of a plurality of layers of middle insulators, the forming of the holes in the middle insulators for passing the contact probes is simplified, and if necessary, it is possible to accommodate some misalignment between the upper and lower needle members.

When two parts made of different metallic materials are rubbed against each other, electric noises could be produced. But according to the present invention, because sliding movement occurs only between a metallic part and a synthetic resin part, possibility of generating such electric noises can be eliminated.

Although the present invention has been described in terms of specific embodiments thereof, it is possible to modify and alter details thereof without departing from the spirit of the present invention.

What is claimed is:

1. A contact probe, comprising:
   an electroconductive needle member having a forward end and a rear end;
   an electrically insulative holder slidably receiving said needle member;
   a coil spring engaging a portion of said needle member and received in said holder, and urging said needle member so as to elastically project said forward end of said needle member from one end of said holder;
   first engagement means provided in said holder for engaging an end of said coil spring remote from said needle member;
   second engagement means provided in said needle member for engaging another end of said coil spring adjacent to said needle member; and
   lead means for establishing an electric contact between said needle member and an external circuit;

said holder comprising a primary insulator member having a through hole for directly receiving said needle member and said coil spring therein and in absence of a tubular holder for the needle member and the coil spring, a secondary insulator member having a first opening coaxially aligned with an end of said through hole and being dimensioned so as to allow said forward end of said needle member to project therefrom but prevent passage of said rear end of said needle member, and a tertiary insulator member having a second opening coaxially aligned with another end of said through hole opposite from said one end, said second opening being provided with an inner diameter smaller than an outer diameter of said coil spring but large enough to allow passage of said lead means therethrough, said insulator members being layered one over the other substantially without any gap therebetween.

2. A contact probe according to claim 1, wherein said needle member forward end is provided with a small diameter portion having an outer diameter smaller than said first opening of said second insulator member, and said rear end is provided with a large diameter portion extending from an end of said small diameter portion remote from said forward end, and said second engagement means consists of a shoulder surface defined at an end of said large diameter portion remote from said forward end.

3. A contact probe according to claim 2, wherein said lead means consists of a lead wire passed through said second opening of said tertiary insulator member and connected to a rear end of said needle member at its free end.

4. A contact probe according to claim 2, wherein said rear end of said needle member comprises a projection projecting from an end of said large diameter portion remote from said forward end, and said shoulder surface is defined between said large diameter portion and said projection.

5. A contact probe according to claim 4, wherein said associated end of said coil spring is soldered to said projection.

6. A contact probe according to claim 1, wherein said end of said coil spring engaged by said second engagement means is wrapped around said rear end of said needle member, and is soldered thereto.

7. A contact probe, comprising:
an electroconductive needle member having a forward end and a rear end;
an insulative holder slidably receiving said needle member;
a coil spring engaged with said needle member and received in said holder, and urging said needle member so as to elastically project said forward end of said needle member from one end of said holder;
first engagement means provided in said holder for engaging an end of said coil spring remote from said needle member;
second engagement means provided in said needle member for engaging another end of said coil spring adjacent to said needle member; and
lead means for establishing an electric contact between said needle member and an external circuit;
said holder comprising a primary insulator member having a through hole for directly receiving said needle member and said coil spring therein and in the absence of a tubular member for the needle member and the coil spring, and a secondary insulator member having an opening coaxially aligned with an end of said through hole opposite from said forward end of said needle member, said opening being provided with an inner diameter smaller than an outer diameter of said coil spring but large enough to allow passage of said lead means therethrough;
said through hole comprising a small diameter portion provided adjacent to said forward end of said needle member, said small diameter portion having a diameter large enough to allow passage of said forward end of said needle member but small enough to prevent passage of said rear end of said needle member.

8. A contact probe according to claim 7, wherein said needle member is provided with a small diameter portion having an outer diameter smaller than said small diameter portion of said through hole of said primary insulator member, and a large diameter portion coaxially extending from an end of said small diameter portion remote from said forward end and having a diameter larger than said small diameter portion of said through hole, and said second engagement means consists of a shoulder surface defined at an end of said large diameter portion remote from said forward end.

9. A contact probe according to claim 7, wherein said lead means consists of a lead wire passed through said opening of said secondary insulator member and connected to a rear end of said needle member at its free end.

10. A contact probe according to claim 8, wherein said rear end of said needle member comprises a projection projecting from an end of said large diameter portion remote from said forward end, and said shoulder surface is defined between said large diameter portion and said projection.

11. A contact probe according to claim 10, wherein said associated end of said coil spring is soldered to said projection.

12. A contact probe according to claim 7, wherein said end of said coil spring engaged by said second engagement means is wrapped around said rear end of said needle member, and is soldered thereto.

13. A contact probe, comprising:
a first electroconductive needle member having a forward end and a rear end;
a second electroconductive needle member having a forward end and a rear end;
an electrically insulative holder slidably receiving said needle members therein with said rear ends thereof opposing each other;
a coil spring interposed between said rear ends of said needle members and directly received in said holder, for urging said needle members so as to elastically project said forward end of each of said needle members from a corresponding end of said holder;
first engagement means provided in said holder for limiting an extent to which said first needle member projects from said corresponding end of said holder;
second engagement means provided in said holder for limiting an extent to which said second needle member projects from said corresponding end of said holder;
said holder comprising a primary insulator member having a through hole for directly receiving said needle members and said coil spring therein and in the absence of a tubular holder for the needle member and the coil spring, a secondary insulator member having a first opening coaxially aligned with an end of said through hole, and allowing said forward end of said first needle member to project therefrom, and a tertiary insulator member having a second opening coaxially aligned with another end of said through hole opposite from said one end, and allowing said forward end of said second needle member to project therefrom, said insulator members being layered one over the other substantially without any gap therebetween;

an inner diameter of each of said first and second openings being large enough to allow said forward end of said corresponding needle member to project therefrom but small enough to prevent passage of said rear end of said corresponding needle member.

14. A contact probe according to claim 13, wherein said second needle member consists of an extension of an associated end of said coil spring.

15. A contact probe according to claim 13, wherein said rear end of at least one of said first and second needle members comprises a large diameter portion which is larger in outer diameter than said coil spring, and a projection coaxially projecting from and end of said large diameter portion remote from said forward end, and an associated end of said coil spring is supported by an annular shoulder surface defined between said large diameter portion and said projection.

16. A contact probe according to claim 15, wherein said associated end of said coil spring is soldered to said projection.

17. A contact probe according to claim 13, wherein at least one end of said coil spring is wrapped around said rear end of the associated needle member, and is soldered thereto.

18. A contact probe according to claim 2, wherein said lead means consists of said spring coil.

19. A contact probe according to claim 2, wherein said lead means consists of said spring coil and a second electroconductive needle member.

20. A contact probe according to claim 3 further including a tubular connector connected to an exposed end of said lead wire and electrically fitted onto said needle member.

21. A contact probe according to claim 7 in which said through hole is diametrically sized to allow sliding movement of said coil spring thereagainst.

22. A contact probe according to claim 7 in which sliding movement of said needle member and said coil spring is only against interior insulative surfaces of said through hole.

23. A contact probe according to claim 22 in which said interior insulative surfaces are constructive of a low friction insulative material.

* * * * *